United States Patent [19]

Suttler

[11] 4,270,173
[45] May 26, 1981

[54] ELECTRONIC SCALER

[76] Inventor: Henry G. Suttler, 61 Sparks St., Cambridge, Mass. 02138

[21] Appl. No.: 82,038

[22] Filed: Oct. 5, 1979

[51] Int. Cl.³ ............................................. G06F 15/20
[52] U.S. Cl. .................................... 364/523; 355/56; 355/61; 364/560; 364/564
[58] Field of Search ........ 364/523, 525, 560, 562–564; 355/55, 56, 61, 75

[56] References Cited

U.S. PATENT DOCUMENTS

| | | | |
|---|---|---|---|
| 3,229,103 | 1/1966 | Rantsch et al. | 250/209 |
| 3,376,578 | 4/1968 | Sawyer | 346/29 |
| 3,410,956 | 11/1968 | Grossimon et al. | 178/19 |
| 3,515,888 | 6/1970 | Lewis | 250/237 |
| 3,571,932 | 3/1971 | Peddie | 33/123 |
| 3,572,925 | 3/1971 | Ables et al. | 364/523 X |
| 3,652,842 | 3/1972 | Lewin | 364/564 |
| 3,674,366 | 7/1972 | Callahan | 355/56 X |
| 3,744,891 | 7/1973 | Dennis et al. | 353/27 |
| 3,749,501 | 7/1973 | Wieg | 356/169 |
| 3,757,320 | 9/1973 | Heath | 340/336 |
| 3,965,340 | 6/1976 | Renner et al. | 364/555 |
| 3,973,326 | 8/1976 | Gallacher et al. | 33/125 R |
| 3,998,546 | 12/1976 | Wally, Jr. et al. | 355/61 X |
| 4,021,115 | 5/1977 | Jeppesen | 355/56 |
| 4,037,325 | 7/1977 | Weber et al. | 33/125 C |
| 4,150,991 | 4/1979 | Dillow | 355/56X |

*Primary Examiner*—Jerry Smith
*Attorney, Agent, or Firm*—Gust, Irish, Jeffers & Hoffman

[57] ABSTRACT

A keyboard having numerical and function keys, function lights to indicate the function being performed, and a digital display, is coupled to a microcomputer. A copy-layout frame has a pair of transparent framing members each of which include first and second arms that have a right angle therebetween. The members are placed relative to one another to define an included rectangular area and are slidably movable relative to one another to correspondingly adjust the area. Orthogonally crossing first arms of the members are provided with a clip which maintains the orthogonal relationship between the arms and carries a sensor which senses movement of each arm under the clip. The sensor is coupled to the computer. The computer is programmed to process the keyboard and sensor inputs to provide layout areas, and leading for printed copy in a desired dimensional format according to desired print size, spacing, and other parameters and to provide layout areas for photographs according to aspect ratio and other desired variables.

35 Claims, 25 Drawing Figures

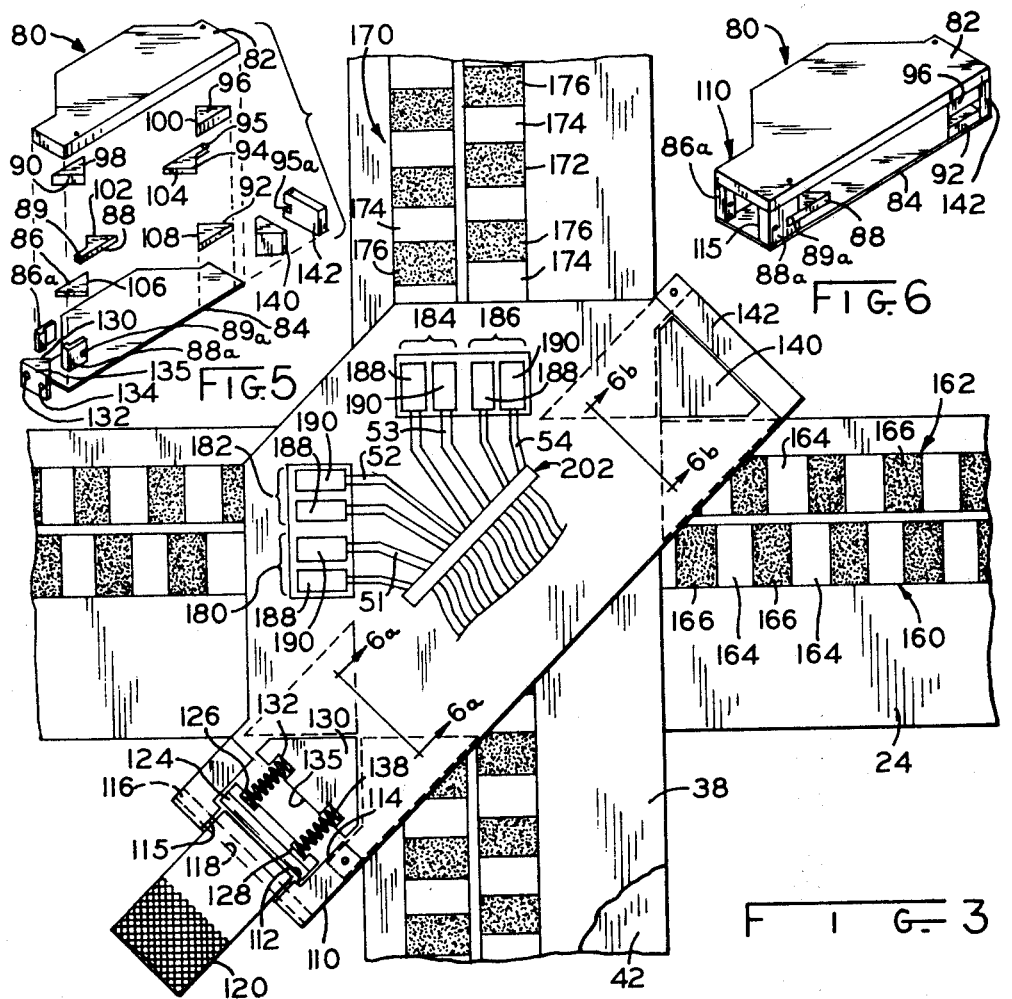
FIG. 3
FIG. 5
FIG. 6
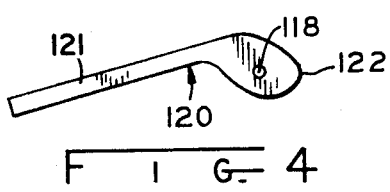
FIG. 4
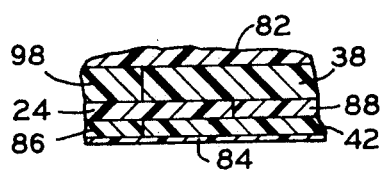
FIG. 6A
FIG. 6B
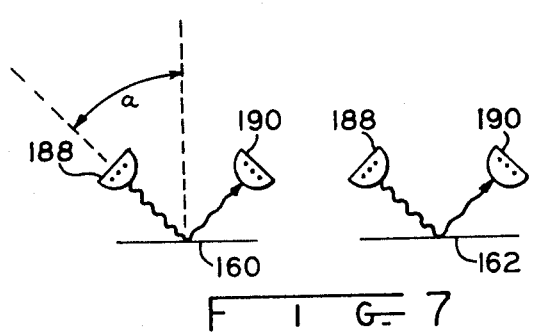
FIG. 7

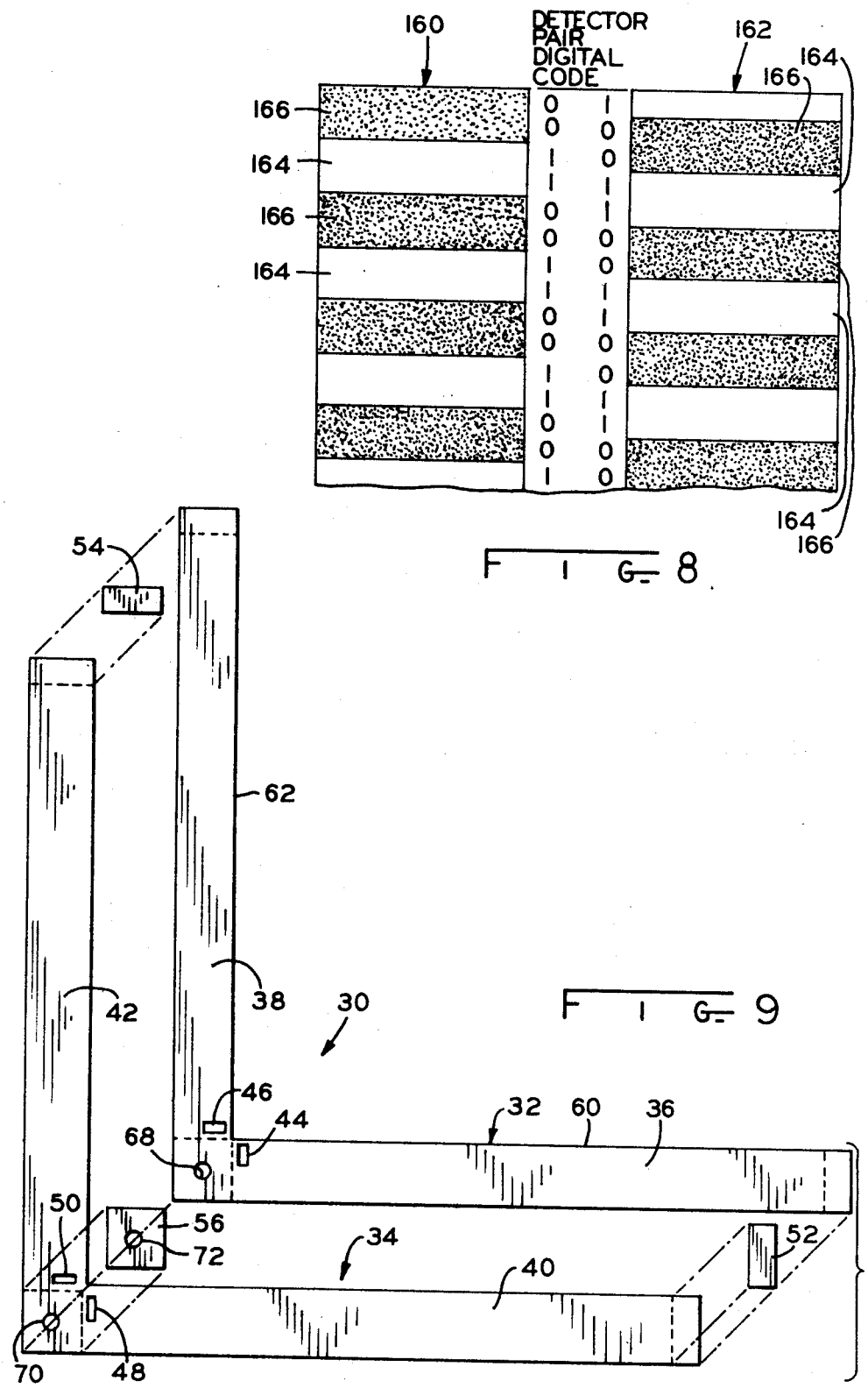

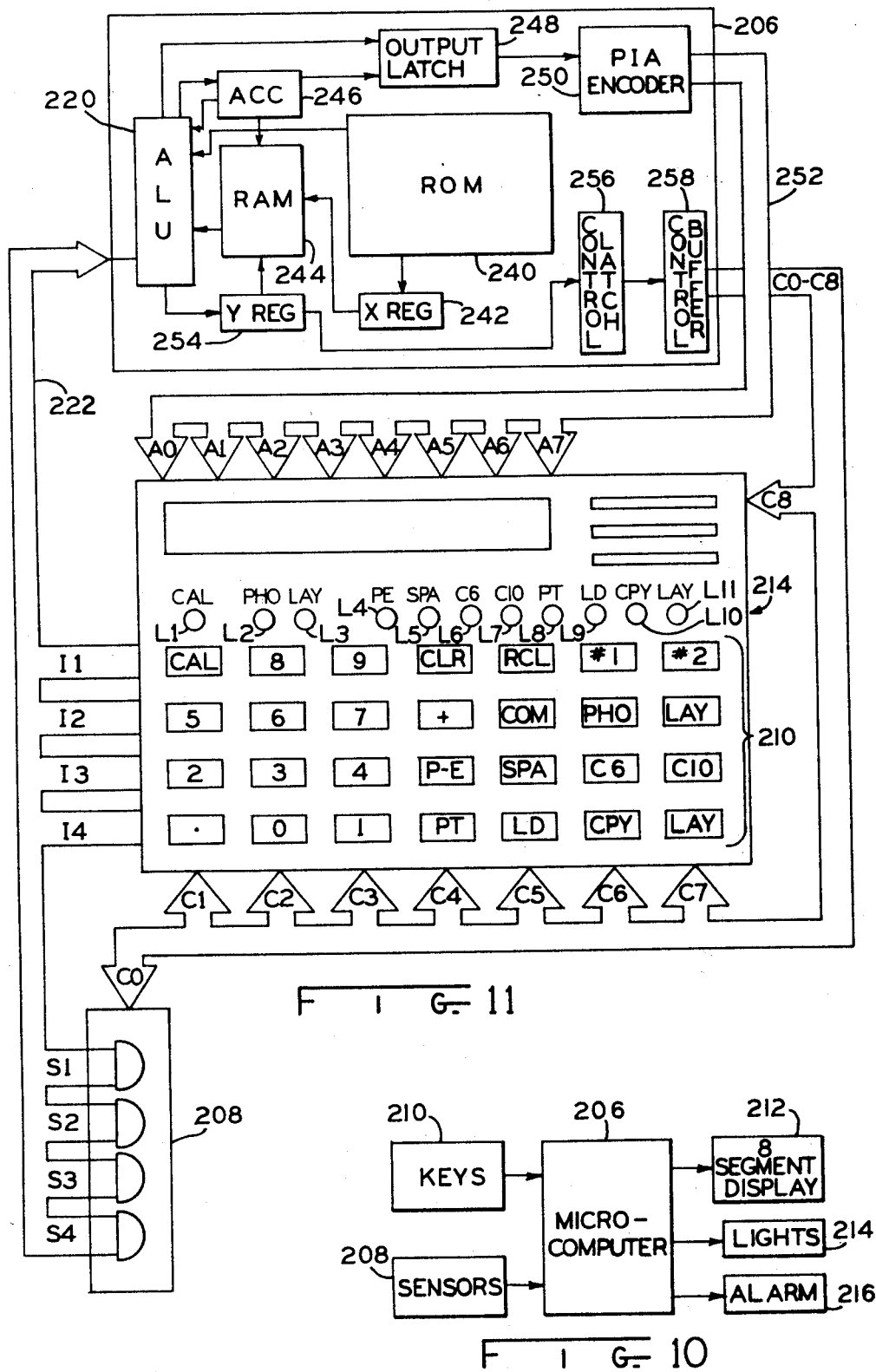

ELECTRONIC SCALER

BACKGROUND OF THE INVENTION

The present invention is in the field of copy to layout and photograph to layout scalers wherein dimensional reductions and enlargements, and desired format changes, are achieved for photographs, printed material, and the like. More particularly, this invention relates to devices for electronically processing desired operator entries on a keyboard and sensed dimensional measurements of a copy or layout and providing a digital display of the desired change.

In the printing industry, it is often required to enlarge, reduce, or change the format of a photograph or fit copy to printed material to enable printing in a desired layout form. This requires time consuming and demanding computations, particularly when a typed copy is to be reduced to printed column format. Aids for providing a proportional reduction or enlargement are available in the art and employ movable members which are placed over the copy or layout to geometrically determine the length and width dimensions before and after the reduction or enlargement. Such devices are limited in their usefulness to indicate only the new dimensions and do not provide the capability of indicating dimensions in a different format having different print, spacing, leading, and the like.

SUMMARY OF THE INVENTION

A pair of members, each of which include first and second arms that form a right angle therebetween, are placed over the copy or layout and define an included rectangle. The first arms of the members orthogonally cross one another and the second arms of the members orthogonally cross one another. A first clip couples the first arms to provide relative sliding movement between the arms, maintaining the orthogonal relationship. A second clip couples the second arms to provide relative sliding movement therebetween, maintaining the relative orthogonal relationship. The members are thus slidably adjustable to one another to vary the size and dimensions of the included rectangle.

The first clip carries a sensor which senses optically, electrically, or mechanically, the position of the first arms, and thus the size of the included rectangle, to provide a signal corresponding to the adjusted position between the arms and the included rectangle size. The sensor outputs are coupled to a microcomputer.

A keyboard is also coupled to the computer and provides for numerical and function data input to the computer which has an output to an eight segment display to provide numerical and message display of data from the computer. Also, the computer has an output to function memory lights for indicating the function mode that has been selected and that is in operation. The segment display indicates the numerical entries and also provides an error message if insufficient or inappropriate data has been entered for any given function mode.

In the copy function mode, the copy size, which may be obtained from sensed member positions and automatically entered, and keyboard entry of the print size, and spacing results in computing of a total number of characters. Character counts, point size, leading, and layout size (width) are keyboard entered and the number of depth inches needed in the layout is computed. In the photo mode, the photo copy size, which may be obtained from the sensed member positions, and automatically entered, and keyboard entry of the aspect ratio, results in computation of the layout photo size.

Thus, copy and photo scaling are available in one device to provide fast, simple, and versatile scaling computations. In copy scaling, any typed copy may be fitted to any rectangular layout without explicit measurement of all dimensions, without any manual computations, and permitting layout inscription. A change in one of the copy scaling variables may be made in the copy fitting algorithm in order to try different combinations of variables to find the most desirable solution. Given any four sets of seven variables, the device will compute and display an eighth, the copy to a desired cropped position. Also, a visual or audible alarm is provided for notice of arm position so that the user can maintain eye contact with the layout, photo, or copy and still be advised when a given arm position is reached. Further, one of the clips is provided with a lock to selectively maintain the members in an adjusted position. With the proper display and alarm sequence, the user is informed not only which direction he should move an arm to obtain the desired layout or copy, but approximately how far the arms should be moved in the indicated direction. The microcomputer is a commercially available mask programmable chip which is relatively inexpensive, small in size, and reliable in operation.

It is therefore, an object of this invention to provide a versatile, fast, relatively simple and inexpensive electronic copy, layout, and photo scaler.

Another object of this invention is to provide an electronic scaler that has framing members which are relatively movable to one another to define an adjustable included rectangular area and which has a sensor which is coupled to a scaler computer to provide electrical inputs corresponding to member position and rectangle size and area.

Another object of this invention is to provide an electronic scaler which will perform necessary scaling calculations which minimizes and makes unnecessary user mathematical calculations.

A further object of this invention is to provide an electronic scaler which can fit any typed copy to any rectangular layout without direct measurement of all dimensions, without any manual computations, and permitting layout inscription.

BRIEF DESCRIPTION OF THE DRAWINGS

FIG. 3 is an enlarged partial, partially broken away view of the framing members, clip and sensor;

FIG. 4 is an enlarged side elevational view of the clip cam lever;

FIG. 5 is a reduced exploded, partial view in perspective of a framing member clip;

FIG. 6 is a perspective view of an assembled frame member clip;

FIGS. 6a and 6b are sectional views along lines 6a—6a and 6b—6b of FIG. 3;

FIG. 7 is a diagrammatic view of the optical sensors used in the device of FIG. 3;

FIG. 8 is an enlarged partial diagrammatic view of the digital code on the framing member arms;

FIG. 9 is an enlarged exploded view of one framing member;

FIG. 10 is a block diagram of the circuit used in a preferred embodiment of this invention;

FIG. 11 is a partially diagrammatic, block diagram of the circuit of FIG. 10;

DETAILED DESCRIPTION

Figure 1:
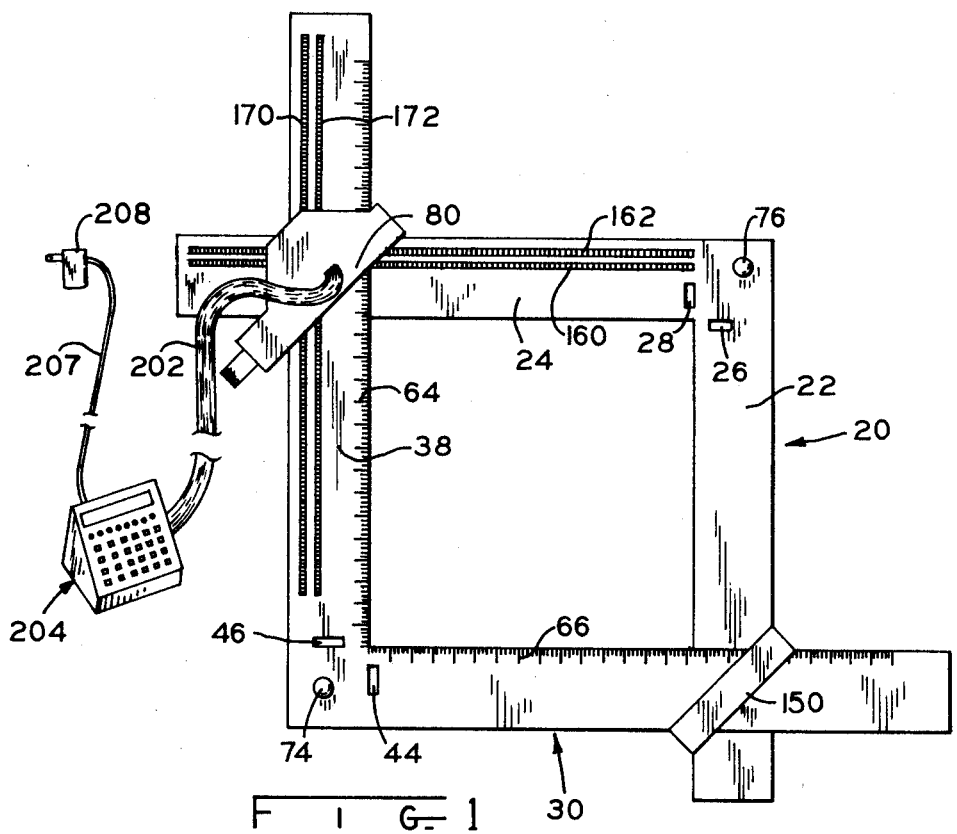
FIG. 1 is a partially diagrammatic and partially perspective top plan view of the framing members, member clips, sensor, and keyboard-computer.
Figure 2:
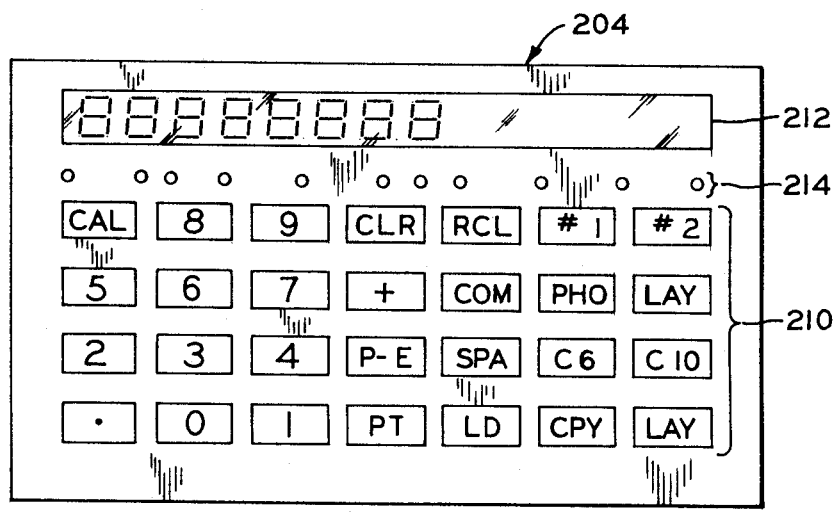
FIG. 2 is an enlarged plan view of the keyboard, segment display, and function memory lights.

Referring to FIGS. 1 and 3–9, framing members having right angle related arms that define an adjustable included rectangular area and the sensing mechanism for sensing adjusted member position are illustrated. Framing member 20 has elongated arms 22, 24 which are integrally connected in right angle relation. Arms 22, 24 have oblong slots 26, 28 respectively, formed near their juncture, in order that the user may place cropping marks on an underlying photograph (not shown). The upper edge of slot 26 is aligned with the lower edge of arm 24 and the right edge of slot 28 is aligned with the left edge of arm 22.

Framing member assembly 30 has upper member 32, FIG. 9, and lower member 34. Member 32 has elongated arms 36, 38 which are integrally connected in right angle relation and member 34 has elongated arms 40, 42 which are rigidly connected in right angle relation. Member 32 is approximately twice as thick as member 34 to provide sturdiness while member 34 is relatively thin so that arms 22 and 24 will lie as flat as possible. Arms 36, 38 have cropping slots 44, 46 respectively, formed near their juncture and arms 40, 42 have cropping slots 48, 50 respectively, formed near their juncture. The left edges of slots 44, 48 are aligned respectively with the right edge of arms 38, 42 and the lower edges of slots 46, 50 are aligned with the upper edges of arms 36, 40.

Oblong spacer 52 is placed between the ends of arms 36, 40 and oblong spacer 54 is placed between the ends of arms 38, 42. Square spacer 56 is placed between the corners of members 32, 34. Member 32 is superimposed on member 34 and spacers 52, 54, and 56 are cemented or otherwise fixed in place. The arms of member 32 are approximately twice the thickness of the arms of member 34 and 20 to provide for sturdiness while the thinness of the members 34, 20 permit the device to lie flat. Further, the total thickness of members 32, 34, and 20 should be as thin as possible so that there is a minimum viewing obstruction of crop marks through slots 46, 44 which are vertically aligned respectively with slots 48, 50, when members 32, 40 are assembled and through slots 26, 28.

The inside edges 60, 62 of arms 36, 38 respectively, are beveled, for easy reading of scales 64, 66 which are marked respectively on arms 36, 38. Scales 64, 66 may be calibrated in points, inches, centimeters, or other desired calibration units. Openings 68, 70, 72 are placed in members 32, 34, and spacer 56 respectively, for receiving the base of a control knob 74 which extends upwardly for manual movement of framing member 30. Member 20, FIG. 1, has a similar knob 76.

Referring to FIGS. 3 and 5, clip 80 has an upper plate-like member 82 and a lower plate-like member 84 spaced in assembly at one end by triangular members 86, 88, and 90 and members 86a and 88a at the opposite end by triangular members 92, 94, 96.

Members 96, 98 are affixed, as by cementing, to member 82 and members 86, 92 are affixed, as by cementing, to member 84. Members 88, 94 have tabs 89, 95, respectively, which are insertable and affixed, as by cementing, in notches 89a, 95a to vertically space member 88 between members 86, 90 and to vertically space member 94 between members 92, 96 for purposes next described.

The thickness of members 90, 96 are selected to provide a channel for sliding movement of arm 38; the thickness of members 88, 94 are selected to provide a channel for sliding fit of arm 24; and the thickness of members 86, 92 are selected to provide a channel for sliding movement of arm 42. Inside edges 98, 100 of members 90, 96 respectively, are in sliding engagement with the opposite longitudinal edges of arm 38. Edges 102, 104 of members 88, 94 respectively, are in sliding engagement with opposite longitudinal edges of arm 24; and edges 106, 108 respectively, are in sliding engagement with opposite longitudinal edges of arm 42. With the above construction, arms 24, 38, and 42 are confined to rectilinear movement, maintaining their orthogonal relationship.

Slide 80 has attached at one end a square shaped housing 110 having a step 112 formed intermediately of square openings 114, 115, in housing 110. A pin 116 is insertable in bore 118 of cam lever 120 having an elongated handle 121 and a cam surface 122. Pin 116 is supported on either side of opening 115 in housing 110 to pivotally support lever 120 in opening 115. A square shaped block 124 having a pair of spring sockets 126, 128 is slidably mounted in opening 114 and seats on step 112 to limit its travel in an outward direction. A prism shaped member 130 is slidably supported between members 82, 84 and has spring sockets 132, 134 formed on side 135 facing block 124. Compression spring 136 fits in sockets 126 and 132 and compression spring 138 fits in sockets 128 and 134 to resiliently urge member 130 against arms 24, 38, and 42 to provide a frictional drag resistance to sliding between the arms and the clip 80.

At the opposite end of clip 80, a second prism shaped member 140 is positioned and supported for sliding movement between members 82, 84 and end wall 142 is affixed, as by cementing, to the ends of members 82, 84. Member 140 abuts arms 24, 38, and 42 and cooperates with member 130 to provide a frictional drag between the arms and clip 80.

When elongated handle 121 of lever 120 is rotated downwardly, lever 120 will pivot about pin 116 causing cam surface 122 to operate against block 124 forcing it inwardly to compress springs 126, 128 causing members 130, 140 to bindingly lock arms 24, 38, and 42 in position. The cam curve on surface 122 provides smooth loading against block 124 until a final snap into locked position.

A second clip 150 having members comparable to members 82, 84 and having triangular members comparable to triangular members 86, 88, 90, 92, 94, and 96 sandwiched between opposite ends thereof in a similar manner and similar spacings except that the triangular members in clip 150 are a mirror image of the triangular members in clip 80 to thus form channels and guiding edges for rectilinear sliding of arms 22, 36 and 40 while maintaining their orthogonal relation, as previously described for arms 24, 32, and 38. Members 20, 30 and clips 80, 150 may be of a plastic or other suitable material.

Referring to FIGS. 1 and 3, arm 24 has implaced on the top surface thereof a pair of parallel elongated strips 160, 162. Each strip 160, 162 has in alternate relation infrared light reflective bands 164 and nonreflective bands 166. The bands are wider in the transverse direction than in the longitudinal direction by a ratio of 2:1 or 3:1 for increased sensitivity, as will become apparent. The reflective bands 164 of strip 160 are staggered with the reflective bands in strip 162 and the length of bands 164,166 is minimized to increase resolution, as will become apparent. In similar manner, arm 38 has emplaced on the top surface thereof a pair of parallel elongated strips 170, 172. Each strip 170, 172 has in alternate relation infrared light reflective bands 174, and non-reflective bands 176 dimensioned similarly to bands 164 and 166 for similar reasons.

Figure 12:
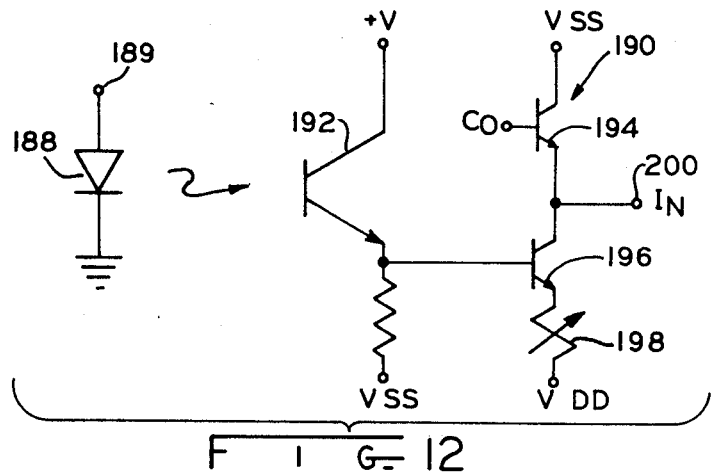
FIG. 12 is a schematic diagram of the optical sensor circuitry.

Mounted in clip 80 are four infrared emitter-detector pairs 180, 182, 184, 186 which are positioned, respectively, over strips 160, 162, 170, 172. Each emitter-detector pair comprises an infrared LED (light emitting diode) 188 and a photo amplifier circuit 190 (FIGS. 7 and 12). LED 188 is supplied at terminal 189 with a positive voltage from the power supply and phototransistor 192 and transistor pair 194, 196 are supplied, with an appropriate voltage. By using infrared emitter-detectors, protection from interference by ambient light is provided.

Referring to FIGS. 3 and 7, infrared light is emitted from LED 188 in emitter-detector pair 180 and directed toward strip 160 and the reflection is detected by phototransistor circuit 190. The angle "a" is relatively small and is shown exaggerated in FIG. 7 for purposes of explanation. In similar manner, the light from LED 188 in pair 182 is directed toward strip 162 and reflection is detected by phototransistor circuit 190. When a reflective band 164 is under pair 180, the reflection impinges on the base of phototransistors 192, FIG. 12, which is coupled to amplifier transistor pair 194, 196 in conventional manner to give a "high" or "1" output at terminal 200. When a non-reflective band 164 166 is under pair 180, a "low" or "0" output will be at terminal 200. Trim resistor 198 is used to adjust for emitter output, sensor band spacing, and sensor sensitivity, circuit component values and input threshold of the microcomputer circuit later described. LED 188 may be an MLED 92 and detector 190 may be a MRD14B, both obtainable from Motorola Inc. Terminal $C_o$ is the enabling terminal for the amplifier circuit 190.

Turning to FIG. 8, arm 24 strips 160, 162 are shown opposite a binary digital code for determining arm 24 position. For example, when emitter-detector pairs 180, 182 are at the top of strips 160, 162, the output from pair 180 will be a "0", since a non-reflective band 166 is under pair 180, and the output from pair 182 will be a "1" since a reflective band is under pair 182. As pairs 180, 182 move downwardly on strips 160, 162, the outputs of pairs 180, 182 will respectively be "0", "0" (both pairs 180, 182 over non-reflective band portions); "1", "0" (pair 180 being over a reflective band portion and pair 182 being over a non-reflective band portion) etc. Thus, it is seen that resolution of arm 24 position is increased by having a pair of strips 160, 162 which have staggered bands. Further, not only is arm position sensed, but direction of arm movement is sensed by comparing the current arm position with the next previous position.

The electrical leads to emitter-detector pairs 180, 182, 184, 186 are contained in harness 202, (FIG. 3) for providing power supply voltage to terminals 189, to each emitter detector pair and for providing a lead from terminal 200 from each phototransistor circuit 190 to keyboard-computer circuit 204, of FIG. 1. Power outlet cord 207 is provided with a conventional plug 208 for connection to a conventional power outlet (not shown) to provide power to circuit 204. A conventional rectifier converts AC power to the required DC power for the circuits later described.

Referring now to FIGS. 1, 10 and 11, the keyboard, computer and sensor circuits will be described. Computer circuit 206 of keyboard-computer 204, FIG. 1, receives sensor input information from sensors 208, which comprises inputs fom each emitter-detector pair 180, 182, 184, 186 through harness 202. Computer circuit 206 also receives input data from keyboard 210, including numerical and function data which has been manually entered, as later described. Computer 206 processes the received data and provides numerical and message data input for 8 segment display 212, function lights 214, and alarm 216. The general manner of circuit operation will now be described.

Referring to FIG. 11, computer 206 has ALU (arithmetic logic unit) 220 which receives data inputs on line 222 from keyboard input lines I1-I4 to indicate which key is depressed, and from sensor 208 lines S1-S4 to indicate the position of framing members 20, 30. ALU 220 also receives input from ROM (read only memory) 240 which is programmed with routines to perform functions, later described, and at a high clock rate reads out its programmed routines and instructions in sequence to ALU 220 and X register 242. Register 242 is coupled to RAM (random access memory) 244 which functions as the scratch pad and also inputs data to ALU 220. RAM 244 stores data for random access presentation to ALU 220 as it is needed.

Accumulator 246 has data input from ALU 220 and provides data at its output to RAM 244, ALU 220, and output latch 248. Latch 248 also has data input from ALU 220 and holds received data for presentation to PIA (peripheral interface adaptor) encoder 250 until the next data input. PIA encoder outputs a digital signal to 8 segment display 212 over cable 252 which has lines A0-A7 which are scanned or sequenced at a high rate, by encoder 250.

Y register 254 receives data inputs from ALU 220 and outputs data to RAM 244 and control latch 256 which in turn outputs data to control buffer 258. Control line C0 couples buffer 258 to sensors 208, enabling sensor 208 so that data can be read by ALU 220 when line C0 carries an enabling signal, but at no other time. Lines C1–C8 are coupled to keyborad 210. Lines C0–C7 are energized sequentially or scanned at a high rate to multiplex the signals of sensor 208 and keyboard 210 to ALU 220 in a manner well known in the hand calculator art. Control line C8 controls function lights 214. Microcomputer 206 is derived from a mask programmed single chip device, Texas Instrument TMS1000.

In operation of the circuit in FIG. 11, sensor information on lines S1–S4 of sensor 208 is entered in ALU 220 when control line C0 is scanned or pulsed from buffer 258. This information is then processed by ALU 220 in accordance with instructions received from ROM 240. ALU 220 is provided with information designating the particular key depression on keyboard 210 in the following manner. Control lines C1–C7 are scanned, or sequentially pulsed, from buffer 258. Each line C1–C7 interrogates a respective column of keys on board 210. For example, line C1 interrogates the first column having keys designated "CAL", "5", "2" and "."; line C2 interrogates the column having keys designated "8", "6", "3", and "0"; etc. As mentioned, only one control line C0–C7 is pulsed at a time. Input lines I1–I4 are switchably coupled, respectively, to each of the four rows of keys on keyboard 210. For example, line I1 is switchably coupled to keys "CAL", "8", "9", "CLR", "RCL", "#1", "#2". Depression of any key in that row switchably coupled the depressed key in that row switchably coupled the depressed key to line I1. When no key in that row is depressed, there is no coupling to line I1 and a "0" level signal is on line I1. However, when a key is depressed, and the appropriate control line C1–C7 is pulsed, a "1" level signal will appear on line I1.

Assume that key "8" is depressed. A switch coupling is made to line I1 but there still will be a "0" level signal until control line C2 is pulsed, at which time a "1" level signal is present on line I1. Therefore, at the instant that line C2 is scanned or pulsed, the signals on line I1–I4 will read "1000", respectively, since there is a "1" level signal on line I1 and "0" level signals on lines I2–I4, there being no other keys depressed. ALU 220 is thus informed that key "8" has been depressed and uses this information, in a manner later to be described, for it computation. In like manner, any key depression on keyboard 210 can be identified to ALU 220 whether it is a numerical key, those being keys 0–9, or a function key, those being the remaining keys. This in effect provides a multiplexing function for reporting to ALU 220 the key depressed on keyboard 210, in accordance with standard calculator technology.

Function lights 214 are controlled by control line C8 which is coupled to all eleven lights, L1–L11 and carries a signal which, in conjunction with A0–A7, will illuminate one or more of the lights, depending on the function mode in which the computer is operating.

Descriptions of the keys from keyboard 210 are as follows:

| KEY | FUNCTION |
|---|---|
| CAL | When the device is first turned on the CAL key is pressed when the user has adjusted the arms to the 10" mark |
| . | Decimal point |
| 0–9 | Data entry keys for copy scaling function |
| CLR | When hit during data entry, clears entry register When hit twice, clears all registers and mode When hit and followed by function key, clears that function's register |
| RCL | When hit and followed by a function key, recalls the value of the function and displays that value in the appropriate fashion (some numeric, some area) |
| #1, #2 | Used for sensor calibration; invokes special routine dedicated to calibration |
| + | When numeric data in entry register is followed by +, characters are added to the total-number-of-characters register |
| COM | When followed by a function key, the function key hit is computed if possible; if not enough data has been entered, an error message results either on the display or in the function lights |
| PHO | Enters the sizes and aspect ratio of the photo into the appropriate registers |
| LAY | Same as PHO but different computation algorithm |
| P-E | 1 P-E means pica; 2 P-E means elite |
| SPA | 1 SPA means single spacing; 2 SPA means double spacing 3.2 SPA means between single and double spacing |
| C6, C10 | 6 point character count, 10 point character count |
| PT | Point size to be used in final type |
| LD | Leading to be used in final type |
| CPY | Enters size of copy into appropriate registers for computation of the total number of characters |
| LAY | Enters size of layout into apropriate registers |

The previously described mechanism and circuitry is employed in the following example of a straightforward copy scaling software routine:

| KEY PRESSED | ACTION | CALCULATION |
|---|---|---|
| P-E | Store value | |
| SPA | Store value | |
| CPY | For each hit of CPY, compute number of characters | (width) (P-E value) = # char./line Integer ((depth) (SPA value)) = # lines (# char./line) (# lines) = # characters add # char. to previous total store value in characters register |
| + | Add entry to # char. | add # char. to previous total store value in characters register |
| C6, C10 | Store values | |
| PT | Store value | |
| LD | Store value | |
| COM Lay | Compute layout area | |
| | Compute char./inch | C10 − C6 = D PT − 6 = X (X) (D) = P C6 + P = characters/inch store value |
| | Compute lines/inch | 72/LD = lines/inch |
| | Compute char./line | (X) (char./inch) = lines |

| KEY PRESSED | ACTION | CALCULATION |
|---|---|---|
| | Compute # lines | (# char.)/(char./line) = # lines |
| | Compute # inches depth | Integer ((lines)/(lines/inch)) |
| | Compare inches to Y | = inches |
| | Display direction needed | |
| | Update inputs: | |
| | if position changed, | |
| | recompute to find depth | |

For the sake of clarity in understanding the present invention, all of the circuit details of the microcomputer and the detailed machine programming steps have not been set forth. The overall arrangement of the microcomputer and the keyboard and the display inputs and outputs have been described in general terms, however, and it is submitted that it is well within the skill of one familiar with the microprocessor art and with machine language programming techniques to program the microcomputer to perform the specific calculations from converting from one photograph size to another or converting between copy and layout when given the present disclosure.

Although the use of a mask-programmed microcomputer may be the preferred embodiment for large-scale production, the use of discrete components, for example, multipliers, dividers, summers, etc., may be more appropriate in a lower production volume environment. This technique for accomplishing the desired calculations will be treated in connection with FIGS. 14–16.

Figure 13:
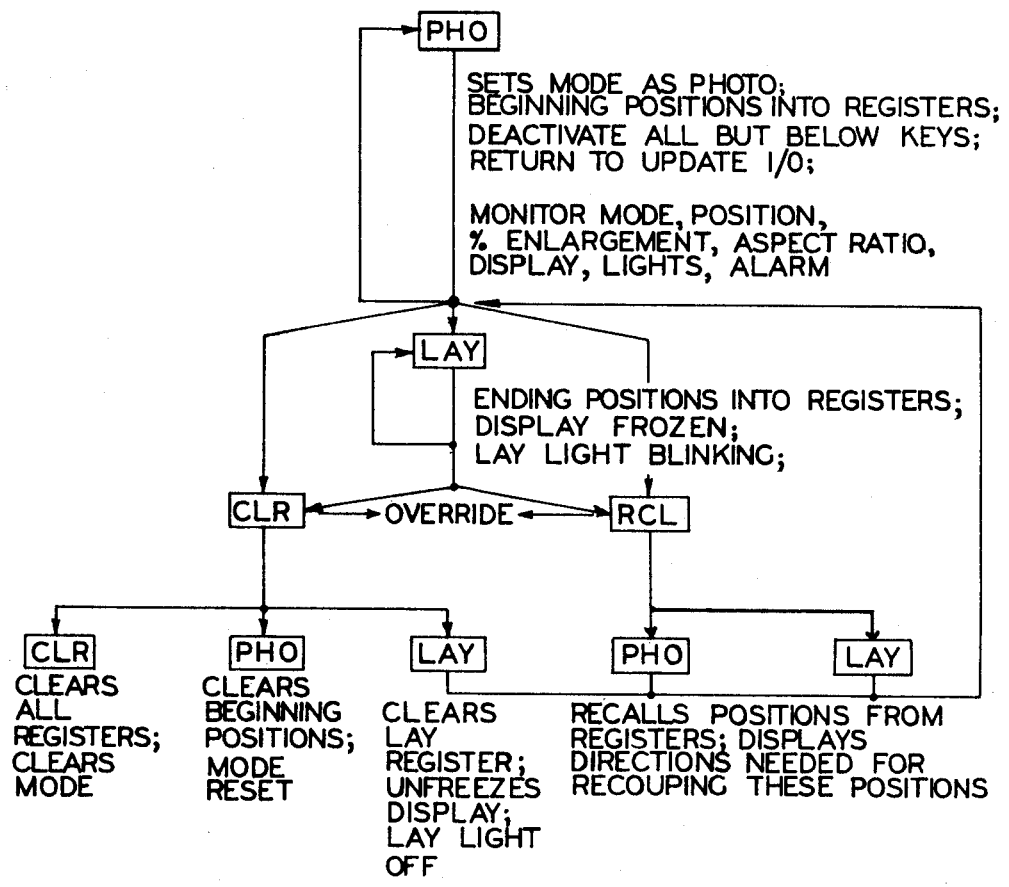
FIG. 13 is a computation block diagram.

An example of a software subroutine for photo scaling is illustrated in FIG. 13. The block designations in FIG. 13 correspond to keys on keyboard 210 and the descriptions associated with each block indicate the function performed upon depressing the corresponding keys.

Once the system is calibrated by moving the arms to a pre-determined position and the CAL key is depressed, the system is put in the photograph to layout mode by pressing the PHO key. This activates and deactivates the appropriate keys and sets the beginning position of the arms 24 and 38 into the appropriate registers. As the arms are moved, the system constantly monitors the mode, position of the arms, percentage enlargement, aspect ratio, display, lights and alarm. When the arms are moved to the desired final position for the layout, the display will indicate the percentage reduction or enlargement, and audio or visual alarms can be utilized to indicate when the same aspect ratio as the beginning aspect ratio has been reached. Alternatively, the desired percentage reduction or enlargement could be entered by way of the keyboard, and an alarm sounded when this has been reached, again with the proper aspect ratio.

Figure 13A:
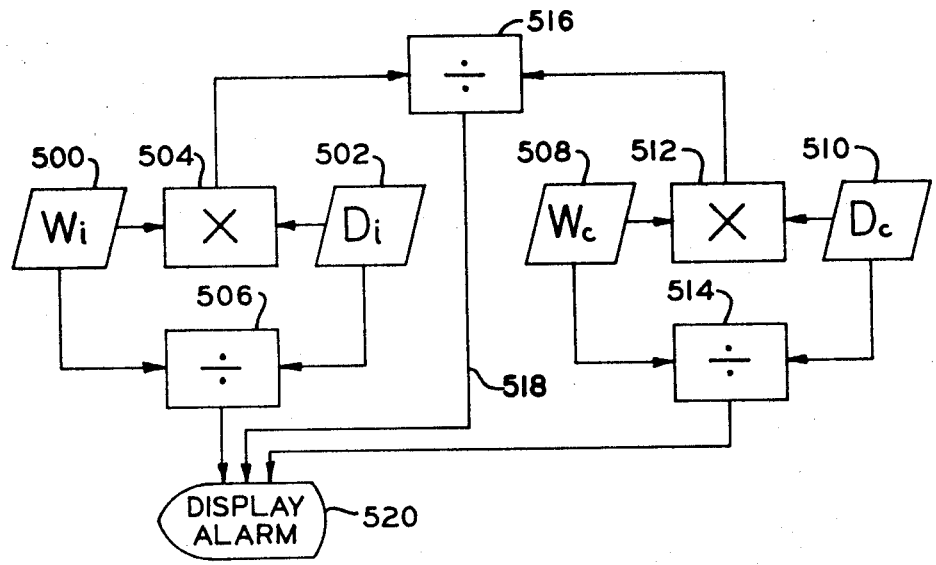
FIG. 13A is a computation block diagram for photograph scaling.

FIG. 13A is a flow chart for the calculations necessary to make percentage enlargements or reductions. It should be noted that each of the blocks could be built as an integral unit, and the flow chart will be described in this manner.

Inputs 500 and 502 contain the initial width and depth as sensed by the sensors 208 and converted to absolute positions of the arms in a manner to be described below. Multiplier 504 provides the area enclosed by the arms 24 and 38, and divider 506 computes the aspect ratio of the enclosed area. Registers 508 and 510 store the current absolute width and depth enclosed by the arms, multiplier 512 computes the area, and divider 514 computes the aspect ratio. Divider 516 divides the initial area provided by multiplier 504 by the final or current area provided by multiplier 512 and provides a signal on line 518 to the display/alarm circuitry 520 indicative of the percentage reduction or enlargement. The outputs from dividers 506 and 514 supply initial and current aspect ratios to the display/alarm circuitry so that they can be compared and an alarm sounded when they are equal to each other.

As indicated above, the circuitry illustrated in FIG. 13A could be built discretely or, alternatively, the same calculations could be performed by the microcomputer 206 using standard calculations subroutines well known to those skilled in the art.

The practical application of the photographic reduction or enlargement function, is to enable a photograph to be reduced in size so that it will fit within a page of photograph and copy layout. This type of procedure is used when laying out school yearbooks, newspapers, magazines, etc. Once the percentage reduction for the photograph is known, this can easily be accomplished by using standard photographic reduction or enlargement equipment. The fact that the area the photograph in question can be circumscribed by the arms 24 and 38 enables the photograph to be properly cropped and a trial layout to be made with the proper aspect ratio.

Figure 12A:
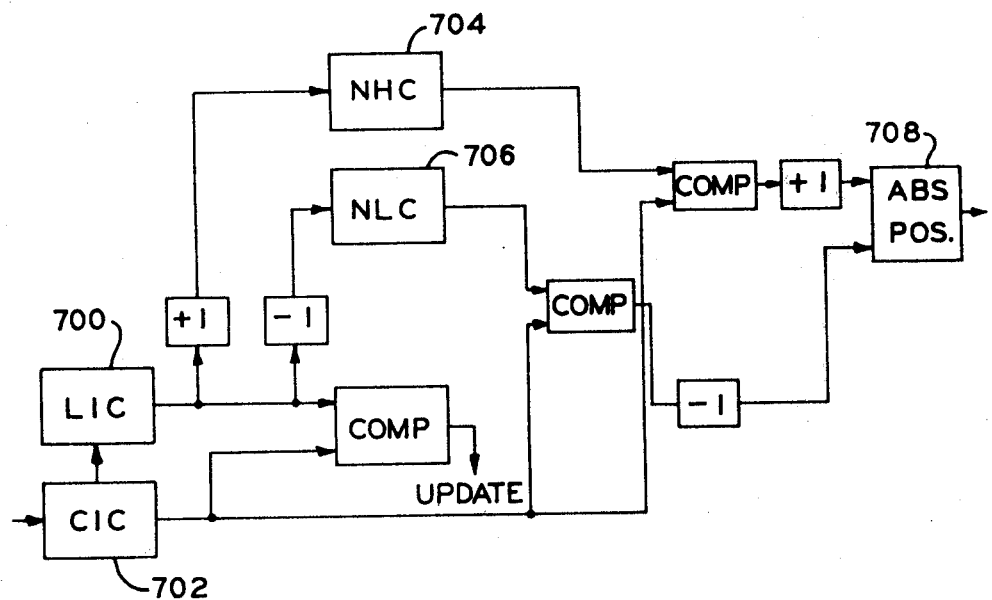
FIG. 12A is the tracking system block diagram.

The absolute positions of the arms are tracked by providing five registers allocated in the RAM (FIG. 12A). The first register 700 contains two bits of data representing the binary code last sensed by the two detectors for one of the arms 24 or 38. For the other arm, a similar two bit register is provided, and the tracking system is essentially identical as that to be described in connection with the first arms. The first register 700 contains the binary code last inputted from a detectors. The second two bit register 702 contains the input code presently being sensed by the detectors 190. The third two bit register 704 contains the next higher code, for example the increment adjacent the currently sensed code and in the direction whereby the spacing between the arms is increased. With the digital pattern illustrated in connection with FIG. 3, if the currently sensed code is 10, the next higher code would be 11. The fourth two bit register 706 contains the next lower code, which, in the case of the example just described, would be 00. The fifth register 708 contains the absolute position of the arm in question relative to the detectors 190.

The sampling of the digital information sensed by the detectors 190 is occurring at a very rapid rate, much greater than the rate at which the coded strips pass underneath the detectors 190. Each cycle of the sampling routine, the current input code in the second register 702 is latched so that it cannot change during the following steps. Then, the current input code in the second register 702 is compared to the last input code in the first register 700, and if they are the same, then the absolute position in the fifth register 708 is unchanged. If the current input code is equal to the next higher code in the third register, 704, however, one increment is added to the number in the absolute position register 708. It will be recalled, that when the arms are calibrated, a predetermined value is entered into the absolute position register 708, for example a location of one hundred increments away from the completely open position of the arms, which may represent an enclosed area of five inches square. The absolute calibration value may be chosen to be whatever is expedient or desirable when designing the programming for the system.

Returning to the comparing subroutine, if the current input code is equal to the next lower code in the fourth register 706, then an increment is subtracted from the absolute position value. In the event there is a malfunction or ambiguous situation and the current input code is neither equal to the next higher code or next lower code, then a recalibrate routine will be necessary. After the increment has been either added to or subtracted from the absolute position value, the last input code is changed to the current input code, and the current input code is unlatched. The subroutine is then repeated over and over so that the absolute position code is always maintained current. The programming and circuitry for this type of position tracking can be easily accomplished, either utilizing discrete components or programming the microcomputer chip 206 in an appropriate manner.

Figure 14:
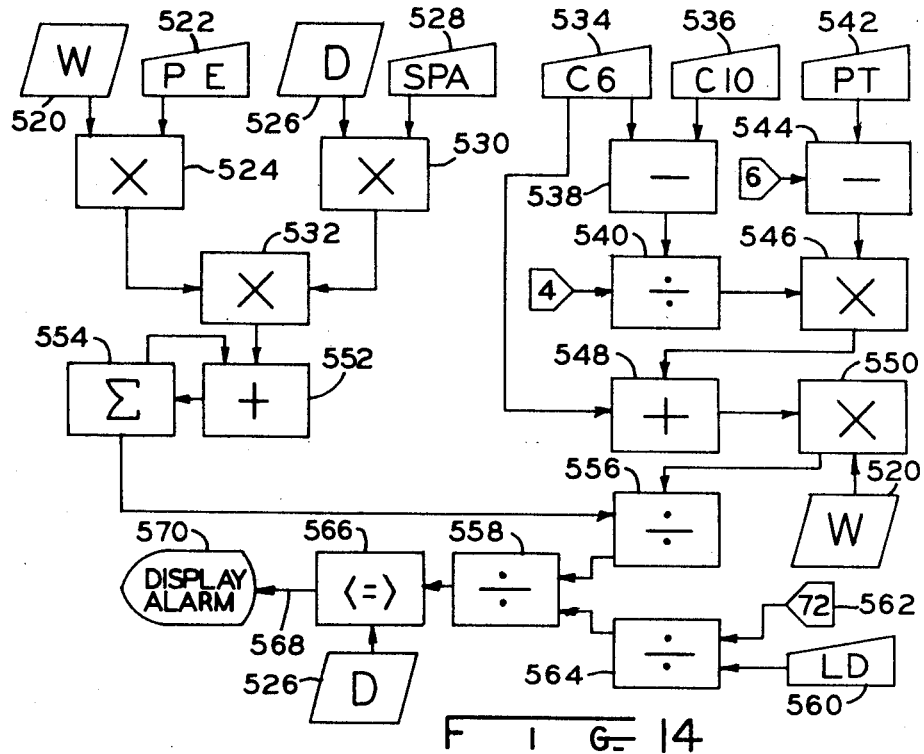
FIG. 14 is a computation block diagram of a copy scaling-layout area routine.
Figure 15:
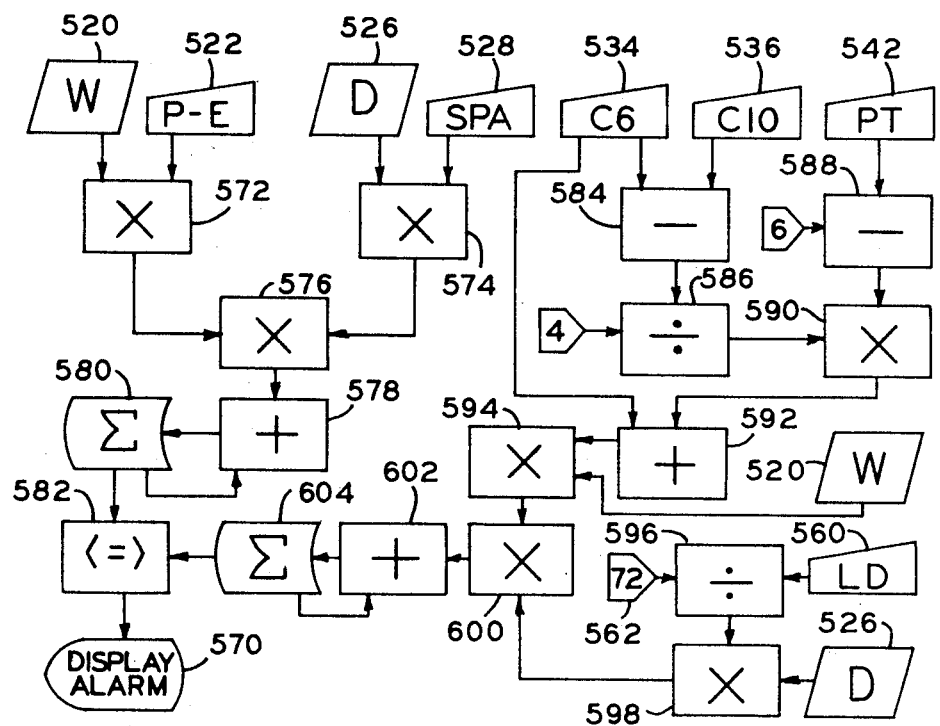
FIG. 15 is a computation block diagram of a copy scaling-copy area routine.
Figure 16:
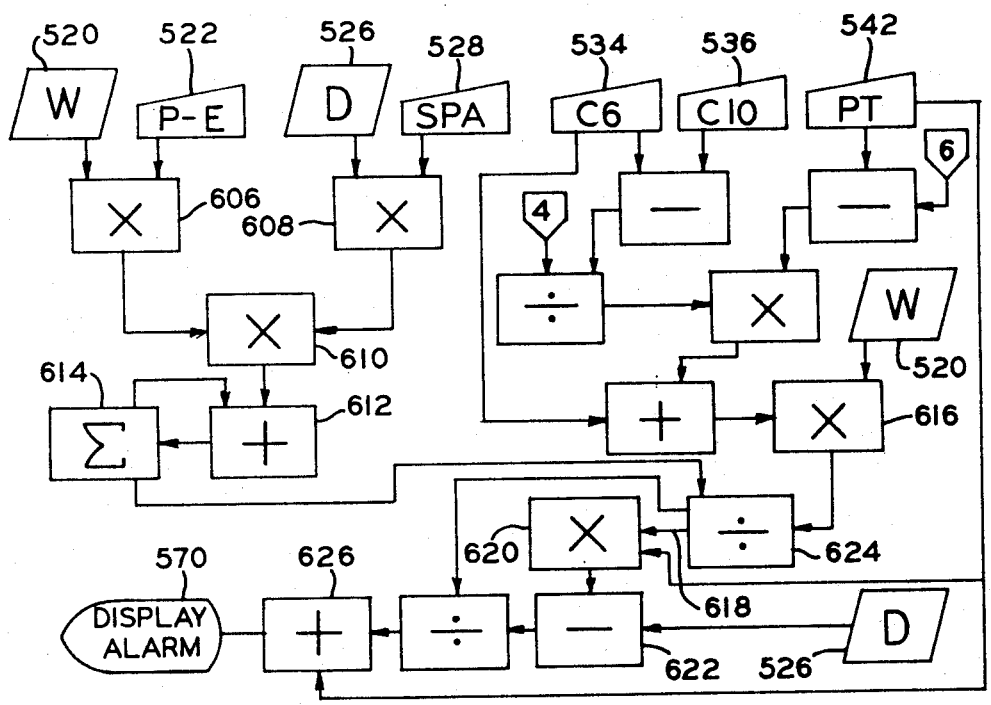
FIG. 16 is a computation block diagram of a copy scaling-leading routine.

FIGS. 14–16 illustrate flow charts for performing three sample computations using the devices illustrated in FIGS. 1–12.

In order to determine the layout area for a given amount of typewritten copy, the steps outlined in the flow chart of FIG. 14 are accomplished. Although FIG. 14 can be viewed as a flow chart related to the key depression sequence and machine computations accomplished by the computer embodiment illustrated in FIG. 11, it would also be possible to accomplish the same thing by an arrangement of discrete electronic units, such as multipliers, adders, dividers, etc. assembled in the manner shown in FIG. 14.

In order to perform the calculations with the computer embodiment, it is necessary to enter a number of known values, such as whether the typewritten material is pica or elite, the spacing, the manufacturer's values for the six point and ten point character count, the point size to be used in the final type and the leading to be used in the final type.

The following is a description of the steps set forth in the flow charts of FIGS. 14, 15 and 16. As indicated above, FIG. 14 is to determine the layout area given a certain amount of typewritten copy. The flow chart of FIG. 15 enables the determination of the copy area given a certain amount of layout area, and the flow chart of FIG. 16 sets forth steps to determine leading.

The steps in the flow chart of FIG. 14 are as follows:

COPY SCALING MODE

EXAMPLE #1: To determine layout area

| STEP | KEY | ACTION | CALCULATION |
|---|---|---|---|
| 1 | # | enter value | |
| 2 | P-E | store value | |
| 3 | # | enter value | |
| 4 | SPA | store value | |
| 5 | COM | ready to compute | |
| 6 | CPY | compute estimated # of characters & store for value | (current width) (P-E value) = # char./1n (horiz) Integer (current depth) (SPA value) = # 1n.s. (vert) |
| 7 | | | (# 1ns) (# char/1n) = # est. characters |
| 8 | | | fetch previous sum and |
| 9 | | | add to # est. characters = total # characters |
| 10 | # | enter value | |
| 11 | C6 | store value | |
| 12 | # | enter value | |
| 13 | C10 | store value | |
| 14 | # | enter value | |
| 15 | PT | store value | |
| 16 | # | enter value | |
| 17 | LD | store value | |
| 18 | COM | ready to compute | |
| 19 | LAY | compute fit between | C10−C6 = difference in character count (CC) |
| 20 | | needed area and | diff. in CC ÷ 4 = # char/inch (hor)/point |
| 21 | | inscribed area | PT − 6 = # of points difference |
| 22 | | | (# pts diff) (char/inch) (hor) /point = correction factor |
| 23 | | | correction factor + C6 = CC/inch (hor) |
| 24 | | | 72 ÷ LD = lines/inch (vert) |
| 25 | | | (current width) (char/inch(hor)) = # char/line |
| 26 | | | Integer [(total # char) ÷ (# char/1n)] = # lines needed |
| 27 | | | (# lines needed) ÷ (lines/inch (vert)) = #inches needed in order to fit the est. total # of characters |
| 28 | | | compare this depth needed to current depth inscribed |

-continued

| STEP | KEY | ACTION | CALCULATION |
|------|-----|--------|-------------|
| 29 | | | display direction needed in order to fit copy |
| 30 | | | Update all computations if current width or depth changes |

The steps in the flow chart of FIG. 15 are as follows:

COPY SCALING MODE
EXAMPLE #2: To determine copy area

| STEP | KEY | ACTION | CALCULATION |
|------|-----|--------|-------------|
| 1 | # | enter value | |
| 2 | C6 | store value | |
| 3 | # | enter value | |
| 4 | C10 | store value | |
| 5 | # | enter value | |
| 6 | PT | store value | |
| 7 | # | enter value | |
| 8 | LD | store value | |
| 9 | COM | ready to compute | |
| 10 | LAY | compute estimated # | C10 − C6 = diff in CC |
| 11 | | of characters in | diff. in CC ÷ 4 = # char/ln(hor)/pt |
| 12 | | inscribed area | PT − 6 = # pts diff |
| 13 | | | (# pts diff) (# char/in(hor)/pt) = corr factor |
| 14 | | | corr factor + C6 = CC/inch(hor) |
| 15 | | | 72 ÷ LD = lins/in(vert) |
| 16 | | | (curr width) (CC/in(hor)) = # char/ln |
| 17 | | | (curr depth) (lns/in(vert)) = # lns |
| 18 | | | (# lns) (# char/ln) = # char |
| 19 | | | add to previous total and save |
| 20 | # | enter value | |
| 21 | P-E | store value | |
| 22 | # | enter value | |
| 23 | SPA | store value | |
| 24 | COM | ready to compute | |
| 25 | CPY | compute fit between | (curr width) (P-E value) = # char/ln |
| 26 | | # char possible in | (curr depth) (SPA value) = lns(vert) |
| 27 | | layout and # char | (# lns) (# char/ln) = # char |
| 28 | | within inscribed area | compare to previous # char |
| 29 | | | display direction needed to equate # char |
| 30 | | | update all computations if current width or depth changes |

The steps in the flow chart of FIG. 16 are as follows:

COPY SCALING MODE
EXAMPLE #3: To determine leading

| STEP | KEY | ACTION | CALCULATION |
|------|-----|--------|-------------|
| 1 | # | enter value | |
| 2 | P-E | store value | |
| 3 | # | enter value | |
| 4 | SPA | store value | |
| 5 | COM | ready to compute | |
| 6–9 | CPY | compute the est. # of characters & store the value | same as in Example #1 |
| 10–16 | | enter and store | same as Example #1 |
| 17 | COM | ready to compute | |
| 18 | LD | compute the leading | (curr width) (CC/in(hor)) = char/ln |
| 19 | | needed to fit the | (# char in copy) ÷ (#char/ln = # lns) |
| 20 | | # char est.above | (PT) (# lns) = d = depth with no leading at all |
| 21 | | into inscribed area | (curr depth) − d = extra length leading must absorb. |
| 22 | | | (extra length) ÷ (# lns) = extra length/ln |
| 23 | | | PT + extra length/ln = leading needed |
| 24 | | | display leading needed to fit copy into layout area |
| 25 | | | update all computations if current width or depth changes |

In FIGS. 14–16, W is the width of the copy, D is the depth of the copy, and display alarm is a visual alarm signal on display 212 or may be an audible alarm.

With reference now to FIG. 14, the arrangement of the elements thereon will be described in terms of discrete arithmetic electrical components, thereby illustrating a manner in which the invention can be constructed, although perhaps not as economically desirable as the computer-type embodiment if large production is desired. The current width value on terminal 520 (eg. an analog voltage) is multiplied by the entered pica/elite value on terminal 522 by multiplier 524, and the current depth value on terminal 526 is multiplied by the spacing value on terminal 528 by multiplier 530. The outputs of multipliers 524 and 530 are connected to multiplier 532.

The manufacturer's C6 value on terminal 534 is subtracted from the C10 value on terminal 536 by subtractor 538 and this output is divided by four in divider 540. A value of 6 is subtracted from the point value on terminal 542 by subtractor 544 and this output is multiplied in multiplier 546 with the output from divider 540. The output of multiplier 546 is added to the C6 value on terminal 534 in adder 548, and this value is multiplied by the current width value from terminal 520 in multiplier 550.

The output of multiplier 532 is added to previous outputs by adder 552 and summer 554 connected in a loop, and this output is fed to divider 556, which divides the output of summer 554 by the output of multiplier 550. The leading input value on terminal 560 is divided into the integer 72 value on terminal 562 by divider 564, and the output of divider 556 is divided by the output of divider 564 by divider 558 which provides an output which is the depth needed in order to fit the estimated total number of characters. This depth is compared with the current depth on terminal 526 by comparator 566, and the output on 568 drives the display/alarm circuit 570. In its simplest form, circuit 570 could provide an audio or visual alarm when a compare condition is sensed by comparator 566.

The arrangement illustrated in FIG. 15 enables the copy area to be determined, given a predetermined layout area. The current width value on terminal 520 and the pica/elite value on terminal 522 are multiplied together in multiplier 572; and the current depth value on terminal 526 and the spacing value on terminal 528 are multiplied together in multiplier 574. The outputs of multipliers 572 and 574 are multiplied by multiplier 576 and this output is summed with previous outputs by adder 578 and summer 580 to provide one input to comparator 582.

The C6 value on terminal 534 is subtracted from the C10 value on terminal 536 by subtractor 584, and this output is divided by four in divider 586. The point value on terminal 542 has an integer 6 subtracted from it in subtractor 588, and this output is multiplied with the output from divider 586 in multiplier 590. The output of multiplier 590 is added to the output of the C6 value on terminal 534 by adder 592, and this output is multiplied with the current width value on terminal 520 by multiplier 594.

Integer 72 is divided by the leading value on terminal 560 in divider 596, and this output if multiplied in multiplier 598 by the current depth value on terminal 526. The outputs of multipliers 594 and 598 are multiplied together by multiplier 600. The output of multiplier 600 is added to previous outputs by adder 602 and summer 604, and the output of summer 604 is compared with the output of summer 580 by comparator 582 and an output fed to display/alarm 570. The display could be programmed to show direction of movement of the arms 24 and 38 to provide the proper fit. Alternatively, an alarm could be sounded when the proper fit is reached.

FIG. 16 illustrates the circuit elements to determine leading. As was the case in connection with FIG. 14, the outputs of multipliers 606 and 608 are multiplied together by multiplier 610 and this output is added to previous outputs by adder 612 and summer 614. The output of summer 614, as was the case in connection with FIG. 14, is divided by the output of multiplier 616 so as to produce on line 618 a value equal to the number of lines. This value is applied in multiplier 620 with the point value, and the product is reduced by the current depth by subtractor 622 to provide a value equal to the extra length which leading must absorb. This extra length value is divided by the number of lines value from divider 624 and added to the point value from terminal 542 in adder 626 to provide a signal to display/alarm 570 the leading needed to fit the copy into the layout area. All computations are updated as the current width or depth changes.

Figure 17:
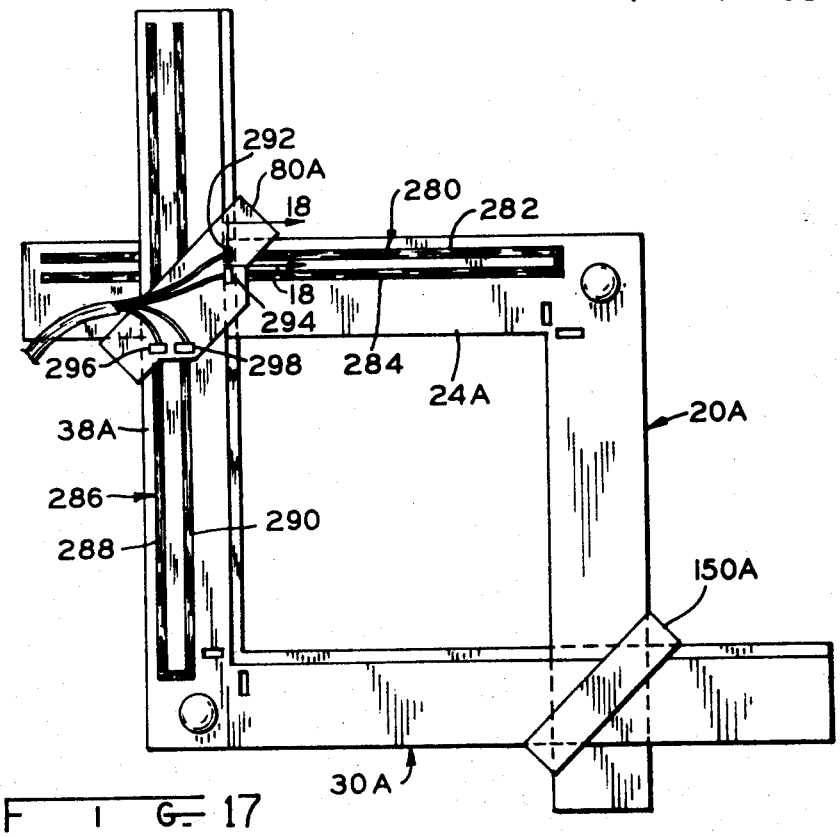
FIG. 17 is a top plan partially diagrammatic view of a second embodiment of this invention for sensing framing member positions.
Figure 18:
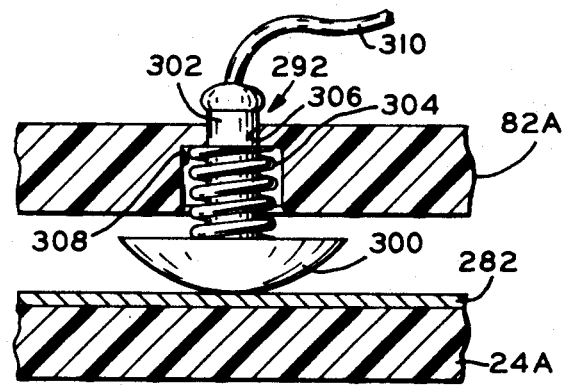
FIG. 18 is an enlarged section taken at 18—18 of FIG. 17.
Figure 19:
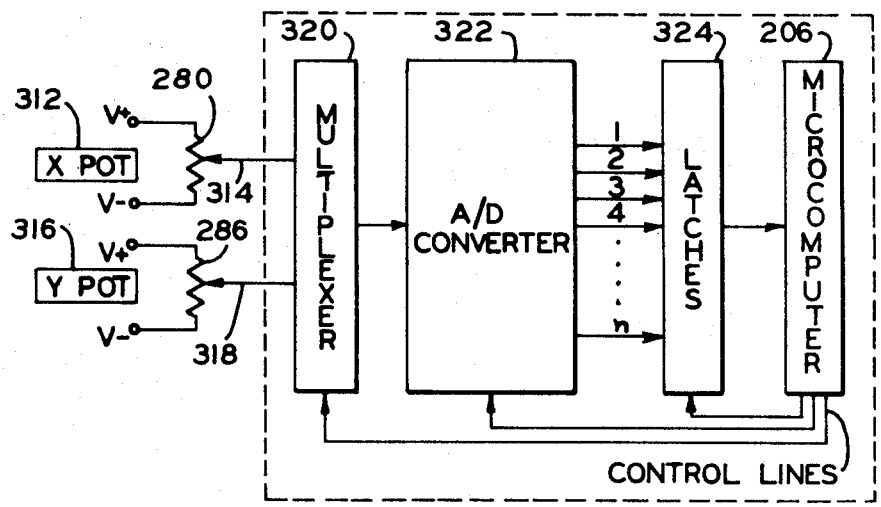
FIG. 19 is a partially schematic block diagram of the circuitry used for the embodiment of FIG. 17.

Referring now to FIGS. 17–19, a second embodiment for providing sensor signals corresponding to the position of the framing members for the copy-photo-layout will be described. Framing members 20A and 30A correspond to framing members 20 and 30 and clips 80A and 150A correspond to clips 80 and 50, with the framing members and clips having essentially the same construction to accomplish the aforementioned rectilinear and relative orthogonal movements to provide a manually adjustable included rectangular area. The primary difference is in the manner of sensing the relative framing member positions. While in the embodiment of FIGS. 1–12 the sensing was accomplished by an optical-electrical system, the sensing in the embodiment of FIGS. 17–19 is accomplished by movement of conductive members mounted on slide 80A along resistive strips on the arms of members 20A and 30A. Thus, instead of a digital signal provided by sensor 208 in the previous embodiment, an analog signal is provided which, as will be described, is digitized by an analog/digital converter.

A U-shaped thick film resistive strip 280 having elongated legs 282, 284 connected at one end is deposited on arm 24A. Similarly, a U-shaped thick film resistive strip 286 having elongated legs 288, 290 connected at one end is deposited on arm 38A. Clip 80A carries four identical conductive pick-up position sensors 292, 294, 296 and 298 which are placed over and are in conductive contact with legs 282, 284, 288, 290, respectively. Referring to FIG. 18, sensor 292 will be described, it being understood sensors 294, 296 and 298 are identical to sensor 292. Sensor 292 has a metallic spherically shaped head 300 having a cylindrical conductive post 302 affixed thereto and extending upwardly therefrom through compression spring 304 and slidably extending through round opening 306 in upper member 82A of clip 80A. Cylindrical cavity 308 is formed in the lower surface of member 82A to accommodate spring 304. Electrical lead 310 is electrically connected to post 302. As thus configured, it is seen that head 300 is resiliently urged towards and into conductive contact with leg 282 and remains in touch contact during the entire travel of arm 24A. As arm 24A moves in its rectilinear path, it is seen that a correspondingly greater or lesser length of strip 280 is included between contact heads 300 of sensor 292, 294, depending on the direction of arm 24A movement.

Referring to FIG. 19, the circuits used with the sensor embodiment of FIGS. 17 and 18 will be described. X potentiometer 312 comprises strip 80 with V+, V voltages applied to the ends of legs 282, 284, respectively and slide 314 comprising leads 310 from each of sensors 292, 294. As arm 24A is moved in its rectilinear path, slide 314 will be correspondingly moved along strip 280 to provide a corresponding voltage to slide 314. In like manner, Y potentiometer 316 comprises strip 286 with V+, V voltages applied to the ends of legs 288, 290 and slide 318 comprises leads 310 from each of sensors 296, 298. As arm 38 is moved in its rectilinear path, slide 318 will be correspondingly moved along strip 286 to provide a corresponding voltage on slide 318.

Multiplexer 320 is provided with a control input from microcomputer 206 to multiplex the voltage signals from slides 314, 318, which are provided in multiplexed format by multiplexer 320 to analog to digital converter 322, which also is provided with a control input from computer 206. A digital signal from converter 322 is provided to latch circuit 324, which also receives a multiplexing control signal from computer 206. Circuit 324 retains each digital signal it receives at its input until ordered by a signal on the control line from computer 206 to reset for a new incoming signal from converter 322. Circuit 324 outputs a digital signal to computer 206 to indicate the position of members 20A, 30A for processing as previously described for the embodiment of FIGS. 1–12. Relatively high resolution framing member position is obtainable with this embodiment.

Figure 20:
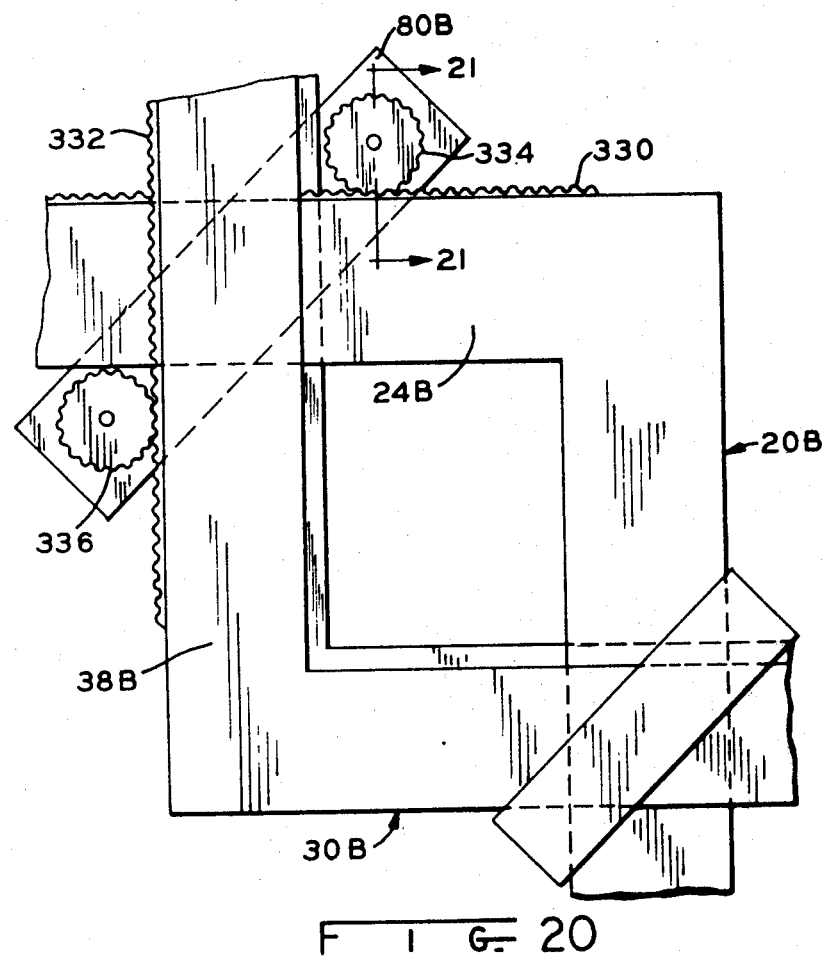
FIG. 20 is a diagrammatic top plan partial view of a third embodiment for sensing framing member positions.
Figure 21:
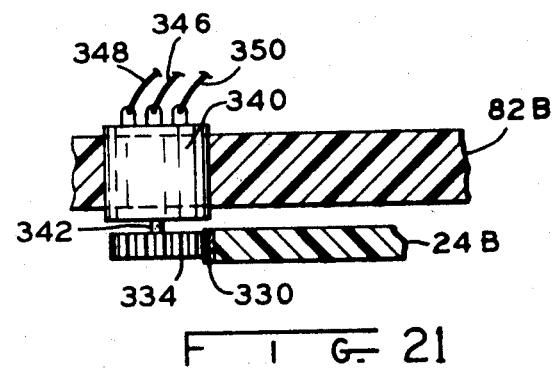
FIG. 21 is a section taken at 21—21 of FIG. 20.

Referring to FIGS. 20 and 21, a mechanical-electrical system of sensing framing member position is illustrated. Framing members 20B, 30B correspond to members 20, 30 in the embodiment of FIGS. 1–12 and are similarly constructed. Arm 24B has gear rack 330 affixed to or integral with its upper edge and arm 38 has gear rack 332 affixed to or integral with its left edge. Clip 80B rotatably supports pinion gears 334, 336 which are positioned so that gear 334 meshes with rack 330 and gear 336 meshes with rack 332. Thus, relative movement of members 20B, 30B in the horizontal direction will rotate gear 334 and relative movement of members 20B, 30B in the vertical direction will rotate gear 336.

Referring now to FIG. 21, the system of converting the rotational position of gear 334 to electrical signals will be described, it being understood that a similar system for gear 336 is provided. Upper plate-like member 82B of clip 80B supports in fixed relation thereto a conventional commercially available rotational multiturn potentiometer 340 having shaft 342 affixed to the potentiometer slide. Shaft 342 is affixed to and rotatable driven by gear 334, so that as gear 344 turns, the potentiometer output, on lead 346 is correspondingly changed. V+ and V voltages are supplied to potentiometer leads 348, 350, respectively. The circuit of FIG. 19 is used to convert the analog signal on lead 346 to a digital output, as previously described for the embodiment of FIGS. 17 and 18, with lead 346 from gear 344 potentiometer corresponding to slide 314 and lead 346 from the gear 336 potentiometer corresponding to slide 318. In this embodiment, also, a relatively high resolution of the framing members 20B, 30B positions is obtainable.

While this invention has been described as having a preferred design, it will be understood that it is capable of further modification. This application is, therefore, intended to cover any variations, uses, or adaptations of the invention following the general principles thereof and including such departures from the present disclosure as come within known or customary practice in the art to which this invention pertains and fall within the limits of the appended claims.

What is claimed is:

1. An electronic photoscaler comprising:
   a first framing arm including two adjacent straight cursor means which are substantially perpendicular,
   a second framing arm having two adjacent straight cursor means which are substantially perpendicular,
   means adjustably connecting said first and second arms together in overlapping arrangement to enclose a rectangular area of adjustable size bordered by said cursor means, said arms being movable relative to each other along orthogonal directions parallel to said cursor means,
   detector means associated with said arms for detecting the degree of relative displacement between said arms along each of said orthogonal directions and providing an output signal quantitatively corresponding to said degree of displacement, and
   electronic calculator means connected to said detector means and having an input connected to said output signal and having a display, said calculator means being responsive to said output signal for storing data corresponding to an initial relative position of said arms and data corresponding to a final relative position of said arms, and providing an indication associated with said display corresponding to the ratio of the areas enclosed by said cursor means in the initial and final positions, respectively, whereby an indication is made of the degree of enlargement or reduction between the respective areas.

2. The apparatus of claim 1 wherein said cursor means comprises inside edges of said arms.

3. The apparatus of claim 2 including graduations on at least one of said arms corresponding to units of linear measurement along each of a pair of perpendicular said edges.

4. The apparatus of claim 1 wherein said display is a visual display.

5. The apparatus of claim 4 wherein said display includes an audible alarm.

6. The apparatus of claim 1 wherein said detector means comprises optical codes on at least one of said arms indicative of relative linear displacement between said arms in said orthogonal directions, and an optical reader for reading said codes and producing said output signal.

7. The apparatus of claim 6 wherein said codes comprise cyclically repetitive digital elements and said detector means includes means for counting said elements as said arms are moved relative to each other, and said output signal corresponds to the number of elements which are counted.

8. The apparatus of claim 6 wherein said detector means comprises said optical codes on both of said arms.

9. The apparatus of claim 1 wherein said detector means comprises resistive strips on said arms, movable contacts for engaging said strips, and means connected to said contacts for producing voltages which vary with the movement of said contacts along said strips, respectively, said output signal being proportional to said voltages.

10. The apparatus of claim 9 and including an analog to digital converter means connected to said voltage for converting said voltage to a digital output, said digital output being said output signal connected to said calculator means input.

11. The apparatus of claim 1 wherein said detector means comprises first and second gears engaging said first and second arms, respectively, said gears being turned by said arms as said arms are moved relative to each other, and voltage modifying means driven by said gears for producing on an output a voltage which varies in accordance with the rotation of said gears, said output signal being proportional to said voltage.

12. The apparatus of claim 11 including an analog to digital counter means connected to said voltage for converting said voltage to a digital output, said digital output being said output signal connected to said calculator means input.

13. The apparatus of claim 1 wherein said calculator means includes a keyboard for selectively inputting data.

14. The apparatus of claim 1 wherein said detector means comprises optical codes on at least one of said arms indicative of relative linear displacement between said arms in said orthogonal directions, an optical reader for reading said codes and producing said output signal, said optical reader comprising a plurality of infrared emitter-detector pairs for reflectively sensing said optical codes.

15. An electronic copyscaler comprising:
a first framing arm including two adjacent straight cursor means which are substantially perpendicular,
a second framing arm including two adjacent straight cursor means which are substantially perpendicular,
means adjustably connecting said first and second arms together in overlapping arrangement to enclose a rectangular area of adjustable size bordered by said cursor means, said arms being movable relative to each other along orthogonal directions parallel to said cursor means,
detector means associated with said arms for detecting the degree of relative displacement between said arms along each of said orthogonal directions and providing an output signal quantatively corresponding to said degree of displacement, and
electronic calculator means connected to said detector means and having an input connected to said output signal, a display and a manually operated data entry means,
said calculator means being responsive to said output signal for storing first position data corresponding to an initial relative position of said arms and copy data inputted by said data entry means and computing character data representative of the amount of copy enclosed by said arms when in their initial relative position,
said calculator means being responsive to said output signal for storing second position data corresponding to a second relative position of said arms and layout data inputted by said data entry means and computing and displaying layout area data representative of the layout area fit, related to said enclosed copy, enclosed by said arms when in the second relative position.

16. The apparatus of claim 15 wherein said display means provides a signal when a proper layout fit relating to said enclosed copy is reached.

17. The apparatus of claim 15 wherein said data entry means is a keyboard.

18. The apparatus of claim 15 wherein said cursor means comprises inside edges of said arms.

19. The apparatus of claim 18 including graduations on at least one of said arms corresponding to units of linear measurement along each of a pair of perpendicular said edges.

20. The apparatus of claim 15 wherein said display is a visual display.

21. The apparatus of claim 15 wherein said display includes an audible alarm.

22. The apparatus of claim 15 wherein said detector means comprises optical codes on at least one of said arms indicative of relative linear displacement between said arms in said orthogonal directions, and an optical reader for reading said codes and producing said output signal.

23. The apparatus of claim 22 wherein said codes comprise cyclically repetitive digital elements and said detector means includes means for counting said elements as said arms are moved relative to each other, and said output signal corresponds to the number of elements which are counted.

24. The apparatus of claim 22 wherein said detector means comprises said optical codes on both of said arms.

25. The apparatus of claim 15 wherein said detector means comprises resistive strips on said arms, movable contacts for engaging said strips, and means connected to said contacts for producing voltages which vary with the movement of said contacts along said strips, respectively, said output signal being proportional to said voltages.

26. The apparatus of claim 25 and including an analog to digital converter means connected to said voltage for converting said voltage to a digital output, said digital output being said output signal connected to said calculator means input.

27. The apparatus of claim 15 wherein said detector means comprises first and second gears engaging said first and second arms, respectively, said gears being turned by said arms as said arms are moved relative to each other, and voltage modifying means driven by said gears for producing on an output a voltage which varies in accordance with the rotation of said gears, said output signal being proportional to said voltage.

28. The apparatus of claim 27 and including an analog to digital converter means connected to said voltage for converting said voltage to a digital output, said digital output being said output signal connected to said calculator means input.

29. The apparatus of claim 15 wherein said detector means comprises optical codes on at least one of said arms indicative of relative linear displacement between said arms in said orthogonal directions, an optical reader for reading said codes and producing said output signal, said optical reader comprising a plurality of infrared emitter-detector pairs for reflectively sensing said optical codes.

30. An electronic copyscaler comprising:

A first framing arm including two adjacent straight cursor means which are substantially perpendicular, a second framing arm including two adjacent straight cursor means which are substantially perpendicular, means adjustably connecting said first and second arms together in overlapping arrangement to enclose a rectangular area of adjustable size bordered by said cursor means, said arms being movable relative to each other along orthogonal directions parallel to said cursor means, detector means associated with said arms for detecting the degree of relative displacement between said arms along each of said orthogonal directions and providing an output signal quantitatively corresponding to said degree of displacement, and electronic calculator means connected to said detector means and having an input connected to said output signal, a display, and a manually operated data entry means, said calculator means being responsive to said output signal for storing first position data corresponding to an initial relative position of said arms and layout data inputted by said data entry means and computing character data representative of the amount of characters enclosed by said arms when in their initial relative positions, said calculator means being responsive to said output signal for storing second position data corresponding to a second relative position of said arms and copy data inputted by said data entry means and computing and displaying copy area data representative of the copy area fit, as related to the enclosed characters, enclosed by said arms when in the second relative positions.

31. An electronic copyscaler comprising:

a first framing arm including two adjacent straight cursor means which are substantially perpendicular, a second framing arm having two adjacent straight cursor means which are substantially perpendicular, means adjustably connecting said first and second arms together in overlapping arrangement to enclose a rectangular area of adjustable size bordered by said cursor means, said arms being movable relative to each other along orthogonal directions parallel to said cursor means, detector means associated with said arms for detecting the degree of relative displacement between said arms along each of said orthogonal directions and providing an output signal quantitatively corresponding to said degree of displacement, and electronic calculator means connected to said detector means and having an input connected to said output signal, a display and a manually operated data entry means, said calculator means being responsive to said output signal for storing first position data corresponding to an initial position of said arms and first character and spacing data inputted by said data entry means and computing the total number of first characters enclosed by said arms, said calculator means being responsive also to said output signal for storing second position data corresponding to a second relative position of said arms and said character data and spacing inputted by said data entry means, and computing the total number of second characters enclosed by said arms, and comparing the total of the first characters with the total of the second characters and displaying output data corresponding to the equivalence or non-equivalence of the first and second character totals.

32. The apparatus of claim 31 wherein said detector means comprises optical codes on at least one of said arms indicative of relative linear displacement between said arms in said orthogonal directions, and an optical reader for reading said codes and producing said output signal.

33. The apparatus of claim 31 wherein said detector means comprises resistive strips on said arms, movable contacts for engaging said strips, and means connected to said contacts for producing voltages which vary with the movement of said contacts along said strips, respectively, said output signal being proportional to said voltages.

34. The apparatus of claim 31 wherein said detector means comprises first and second gears engaging said first and second arms, respectively, said gears being turned by said arms as said arms are moved relative to each other, and voltage modifying means driven by said gears for producing on an output a voltage which varies in accordance with the rotation of said gears, said output signal being proportional to said voltage.

35. The apparatus of claim 31 wherein the output data is indicative of the leading required to provide a fit of the first total of characters in the area enclosed by said arms in the second relative positions.

* * * * *